United States Patent
Wang et al.

(10) Patent No.: US 11,609,268 B2
(45) Date of Patent: Mar. 21, 2023

(54) DEBUG SYSTEM PROVIDING DEBUG PROTECTION

(71) Applicant: Realtek Semiconductor Corp., HsinChu (TW)

(72) Inventors: Jieyu Wang, Suzhou (CN); Zhaoming Li, Suzhou (CN); Zuohui Peng, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/534,434

(22) Filed: Nov. 23, 2021

(65) Prior Publication Data
US 2022/0170985 A1    Jun. 2, 2022

(30) Foreign Application Priority Data
Nov. 27, 2020   (CN) .......................... 202011363695.1

(51) Int. Cl.
*G06F 7/50*    (2006.01)
*G01R 31/317*    (2006.01)
*G01R 31/319*    (2006.01)

(52) U.S. Cl.
CPC . *G01R 31/31705* (2013.01); *G01R 31/31903* (2013.01)

(58) Field of Classification Search
USPC ................ 716/136; 714/2, 39, 48, 724, 725
See application file for complete search history.

(56) References Cited

U.S. PATENT DOCUMENTS

| 7,466,668 | B2 | 12/2008 | Dove |
| 7,844,997 | B2 * | 11/2010 | Tucker .................... G06F 11/27 726/34 |
| 2007/0022323 | A1 * | 1/2007 | Loh ................ G01R 31/318314 714/38.14 |
| 2019/0361073 | A1 * | 11/2019 | Trantham ............ G06F 11/3656 |

FOREIGN PATENT DOCUMENTS

| CN | 1693916 A | * | 11/2005 | ....... G01R 31/31835 |
| CN | 201812014 U | * | 4/2011 | |
| CN | 110058069 A | * | 7/2019 | |
| CN | 211669520 U | * | 10/2020 | |
| JP | H07167915 A | * | 7/1995 | |
| JP | H08226958 A | * | 9/1996 | |
| TW | 202020716 A | | 6/2020 | |

* cited by examiner

*Primary Examiner* — Brian Ngo
(74) *Attorney, Agent, or Firm* — Winston Hsu

(57) ABSTRACT

A debug system includes a chip to be tested and a debug controller. The chip to be tested includes a circuit to be tested, a debug access circuit and a debug protection circuit. When a protection function is not enabled, the debug protection circuit enables a communication between the debug access circuit and the chip to be tested, the debug controller accesses the data of the chip to be tested via the debug access circuit for debugging the circuit to be tested. When the protection function is enabled, the debug protection circuit blocks the communication between the debug access circuit and the chip to be tested, the debug controller transmits a message to the debug protection circuit via the debug access circuit, and the debug protection circuit determines whether to disable the protection function according to the message.

16 Claims, 3 Drawing Sheets

DEBUG SYSTEM PROVIDING DEBUG PROTECTION

CROSS REFERENCE TO RELATED APPLICATION

This non-provisional application claims priority of China patent application No. 202011363695.1, filed on 27 Nov. 2020, included herein by reference in its entirety.

BACKGROUND OF THE INVENTION

1. Field of the Invention

The present invention relates to a debug system, and in particular, a debug system having a debug protection circuit.

2. Description of the Prior Art

During the development of chips, a debugging channel specified by serial wire debug (SWD) interfaces or joint test action group (JTAG) may be incorporated in the chip to effectively control the operations of the chip to perform debugging. In this way, program developers may access the contents of the memory in the chip via the debugging channels to track the operation of the chip and to debug the program, so as to locate the abnormal location therein. Nevertheless, the debugging channel in the chip may raise the concern of information breach after the chip development is completed. For example, hackers may obtain confidential information inside the chip via the debugging channels, or even tamper the chip, resulting in device damage or performing unauthorized functions using the device.

SUMMARY OF THE INVENTION

According to an embodiment of the invention, a debug system includes a chip under test and a debug controller. The chip under test includes a first circuit under test, a debug interface, a debug access circuit and a debug protection circuit. The first circuit under test is used to perform a first function. The debug access circuit is coupled to the first circuit under test and the debug interface. The debug protection circuit is coupled to the first circuit under test and the debug access circuit, and is used to enable communication between the debug access circuit and the first circuit under test when a first protection function is disabled, block the communication between the debug access circuit and the first circuit under test when the first protection function is enabled, and determine whether to disable the first protection function according to a first write message transmitted from the debug access circuit. The debug controller is selectively coupled to the debug interface and is used to transmit the first write message to the debug protection circuit via the debug access circuit when the first protection function is enabled, and access the data in the first circuit under test via the debug access circuit to debug the first circuit under test when the first protection function is disabled.

According to an embodiment of the invention, a debug system includes a first chip under test and a debug controller, the first chip under test includes a first circuit under test, a debug interface, a debug access circuit, and a debug protection circuit. The debug interface is coupled to the debug controller and the debug access circuit. The debug access circuit is coupled to the first chip under test. The debug protection circuit is coupled to the first chip under test and the debug access circuit. A method of operating the debug system includes: when a first protection function is disabled, the debug protection circuit enabling communication between the debug access circuit and the first circuit under test; and the debug controller accessing data in the first circuit under test via the debug access circuit to debug the first circuit under test, and when the first protection function is enabled, the debug protection circuit blocking the communication between the debug access circuit and the first circuit under test, the debug controller transmitting a first write message to the debug protection circuit via the debug access circuit, and the debug protection circuit determining whether to disable the first protection function according to the first write message transmitted from the debug access circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
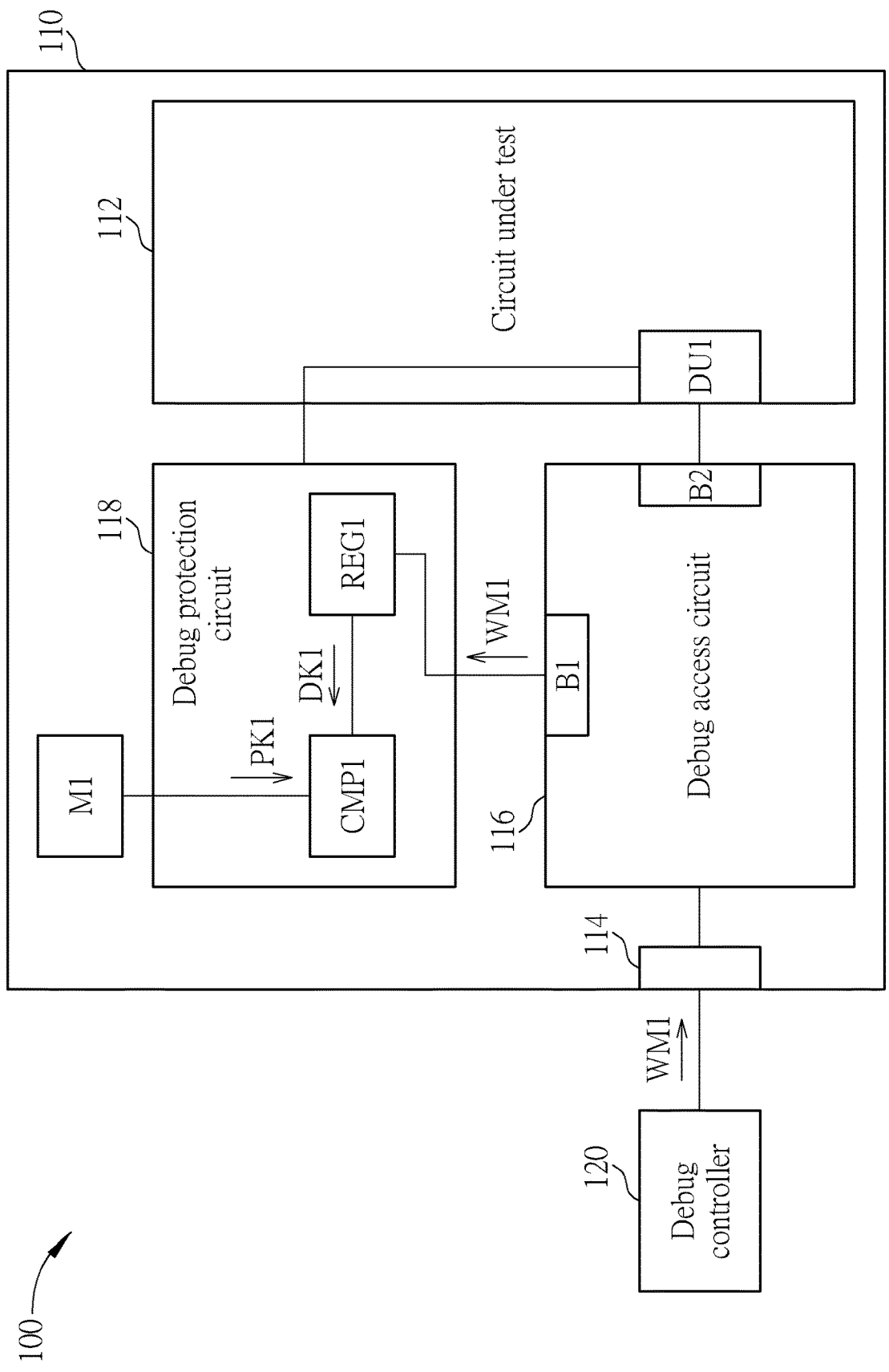
FIG. 1 is a schematic diagram of a debug system according to an embodiment of the invention.

FIG. 1 is a schematic diagram of a debug system 100 according to an embodiment of the invention. The debug system 100 may include a chip under test 110 and a debug controller 120. The chip under test 110 may include a circuit under test 112, a debug interface 114, a debug access circuit 116 and a debug protection circuit 118. In some embodiments, the chip under test 110 may be a chip under development, and the circuit under test 112 may be a circuit block configured to perform functions under development. The debug controller 120 may be selectively coupled to the debug interface 114, and may be, but is not limited to, coupled to the debug interface 114 via a probe, so as to debug the circuit under test 112 in the chip under test 110.

In FIG. 1, the debug access circuit 116 may be coupled to the circuit under test 112, the debug interface 114, and the debug protection circuit 118. In some embodiments, the debug access circuit 116 may include a control interface B1 and a high-speed interface B2. The control interface B1 may be coupled to the debug protection circuit 118, and the high-speed interface B2 may be coupled to the circuit under test 112, and the transmission rate of the high-speed interface B2 may be higher than that of the control interface B1. For example, the control interface B1 may be, but is not limited to, an advanced peripheral bus (APB) interface, and the high-speed interface B2 may be, but is not limited to, an advanced high performance bus (AHB) interface.

The debug controller 120 may access the data in the circuit under test 112 via the debug access circuit 116 to debug the circuit under test 112. However, in order to prevent information leakage owing to unauthorized users accessing or tampering the data in the circuit under test 112 via the debug interface 114 after testing or shipment of the chip under test 110, the debug protection circuit 118 may perform a protection function to block the communication between the debug access circuit 116 and the circuit under test 112. In this manner, the unauthorized users cannot continue to use the debug interface 114 to access the information in the circuit under test 112, and the information security of the chip under test 110 can be ensured.

For example, when the protection function is disabled, the debug protection circuit 118 may enable the communication between the debug access circuit 116 and the circuit under test 112, and the debug controller 120 may employ the debug access circuit 116 to access the data in the circuit under test 112 to debug the same. In some embodiments, the debug protection circuit 118 may enable the protection function after the debug controller 120 completes debugging processes. When the protection function is enabled, the debug protection circuit 118 may block the communication between the debug access circuit 116 and the circuit under test 112. During such time, if the debug controller 120 is configured to debug the circuit under test 112, the debug controller 120 may first transmit the write message WM1 to the debug protection circuit 118 via the debug access circuit 116, and the debug protection circuit 118 may determine whether to disable the protection function according to the write message WM1.

In some embodiments, the debug controller 120 may transmit the write message WM1 to write the debug key DK1 therein into the register REG1 in the debug protection circuit 118, and the debug protection circuit 118 may use a comparator CMP1 to compare the debug key DK1 and a pre-stored protection key PK1, and determine whether to disable the protection function according to the comparison result.

For example, the circuit under test 112 may generate the protection key PK1, and transmit the protection key PK1 to the debug protection circuit 118, and the debug protection circuit 118 may store the protection key PK1 prior to performing the protection function. However, in some embodiments, the protection key PK1 may also be generated by the debug protection circuit 118 itself.

In addition, in order to prevent tampering of the protection key PK1, the chip under test 110 may also include an one-time programmable (OTP) memory M1, and the debug protection circuit 118 may store the protection key PK1 in the one-time programmable memory M1. In this manner, the protection key PK1 may be prevented from being overwritten.

When the protection function is enabled, the debug protection circuit 118 compares the debug key DK1 and the protection key PK1, and if the debug key DK1 matches the protection key PK1, the debug controller 120 is authorized, and the debug protection circuit 118 may disable the protection function to enable the communication between the debug access circuit 116 and the circuit under test 112. Conversely, if the debug key DK1 is different from the protection key PK1, the debug controller 120 is not authorized, and the debug protection circuit 118 may retain the protection function and continue to block the communication between the debug access circuit 116 and the circuit under test 112, thereby preventing data in the circuit under test 112 from being accessed by an unauthorized circuit.

In some embodiments, in order to prevent unauthorized devices from trying to use different debug keys to crack the protection function of the debug protection circuit 118, the debug protection circuit 118 may continuously transmit a predetermined number of write messages to the debug controller 120. The predetermined number may be, but is not limited to 5. When the keys in the write messages are different from the protection key PK1, the debug protection circuit 118 may stop determining whether to disable the protection function according to the written messages, and keep the protection function enabled to ensure the information security of the chip under test 110.

In FIG. 1, the circuit under test 112 may include a debug management unit DU1, and the debug management unit DU1 may be coupled to the debug access circuit 116 and the debug protection circuit 118. In some embodiments, the debug management unit DU1 may be implemented by, but is not limited to, a switch element, and may control the electrical connection between the debug access circuit 116 and the circuit under test 112. In this manner, the debug protection circuit 118 may block or enable the communication between the debug access circuit 116 and the circuit under test 112 by controlling the debug management unit DU1.

In some implementations, the debugging management unit DU1 may also be implemented by a controller or a processor in the circuit under test 112 that executes a corresponding program. For example, the debugging program may support different types of debug modes, e.g., providing an invasive debug mode and a non-invasive debug mode to a secure area and a non-secure area of the circuit under test 112, respectively. In such a case, the debug protection circuit 118 may control the debug management unit DU1 to turn off all debug modes when performing the protection function, and the circuit under test 112 may ignore all signals from the debug access circuit 116, and may not communicate with the circuit under test 112 via the debug access circuit 116. However, while the debug protection circuit 118 is configured to disable the protection function, the debug protection circuit 118 may enable the debug management unit DU1 to fully enable or partially enable the debug mode, and the debug controller 120 may communicate with the circuit under test 112 via the debug access circuit 116.

Figure 2:
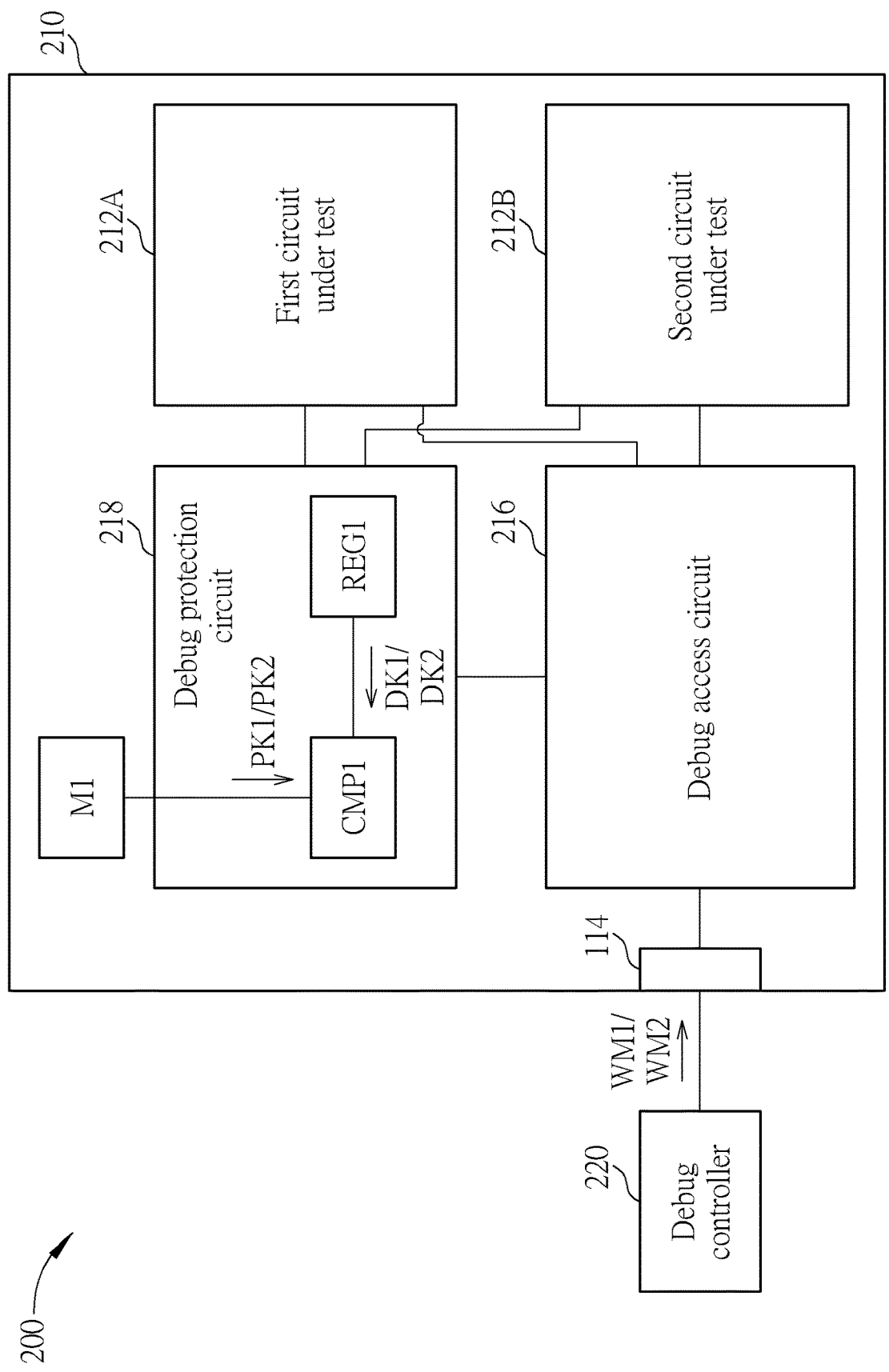
FIG. 2 is a schematic diagram of a debug system according to another embodiment of the invention.

FIG. 2 is a schematic diagram of a debug system 200 according to another embodiment of the invention. The debug system 200 and the debug system 100 may be constructed in similar structure and operate in similar principles. The chip under test 210 of the debug system 200 may include a plurality of circuits under test, such as a first circuit under test 212A and a second circuit under test 212B. The first circuit under test 212A and the second circuit under test 212B may be respectively coupled to the debug access circuit 216 and the debug protection circuit 218, and may respectively perform different functions.

In some embodiments, the debug protection circuit 218 may perform the first protection function and the second protection function. When the first protection function is disabled, the debug controller 220 may access the data of the first circuit under test 212A via the debug access circuit 216 to debug the first circuit under test 212A. When the first protection function is enabled, the debug protection circuit 218 may block the communication between the debug access circuit 216 and the first circuit under test 212A. The debug controller 220 may transmit a first write message WM1 to the debug protection circuit 218 via the debug access circuit 216, and the debug protection circuit 218 may determine whether to disable the first protection function according to the first write message WM1.

Similarly, when the second protection function is disabled, the debug controller 220 may access the data of the second circuit under test 212B via the debug access circuit 216 to debug the second circuit under test 212B. When the second protection function is enabled, the debug protection circuit 218 may block the communication between the debug access circuit 216 and the second circuit under test 212B. The debug controller 220 may transmit a second write message WM2 to the debug protection circuit 218 via the debug access circuit 216, and the debug protection circuit 218 may determine whether to disable the second protection function according to the second write message WM2.

In some embodiments, the first protection function and the second protection function may be enabled or disabled simultaneously, that is, when the debug protection circuit 218 executes one of the first protection function and the second protection function, the other one of the two will be executed simultaneously. When the debug protection circuit 218 disables one of the first protection function and the second protection function, the other one of the two will be disabled simultaneously. However, the present invention is not limited to the simultaneous execution of the first protection function and the second protection function. In some embodiments, the first protection function and the second protection function may be controlled separately.

In some embodiments, the debug protection circuit 218 may store the first protection key PK1 and the second protection key PK2, the first write message WM1 may include a first debug key DK1, and the second write message WM2 may include a second debug key DK2. In such a case, when the first protection function is enabled, the debug protection circuit 218 may compare the first debug key DK1 and the first protection key PK1, and disable the first protection function to enable the communication between the debug access circuit 216 and the first circuit under test 212A when the first debug key DK1 matches the first protection key PK1. Similarly, when the second protection function is enabled, the debug protection circuit 218 may compare the second debug key DK2 and the second protection key PK2, and disable the second protection function to enable the communication between the debug access circuit 216 and the second circuit under test 212B when the second debug key DK2 matches the second protection key PK2. In other words, the debug protection circuit 218 may separately control the protection functions of the first circuit under test 212A and the second circuit under test 212B.

Figure 3:
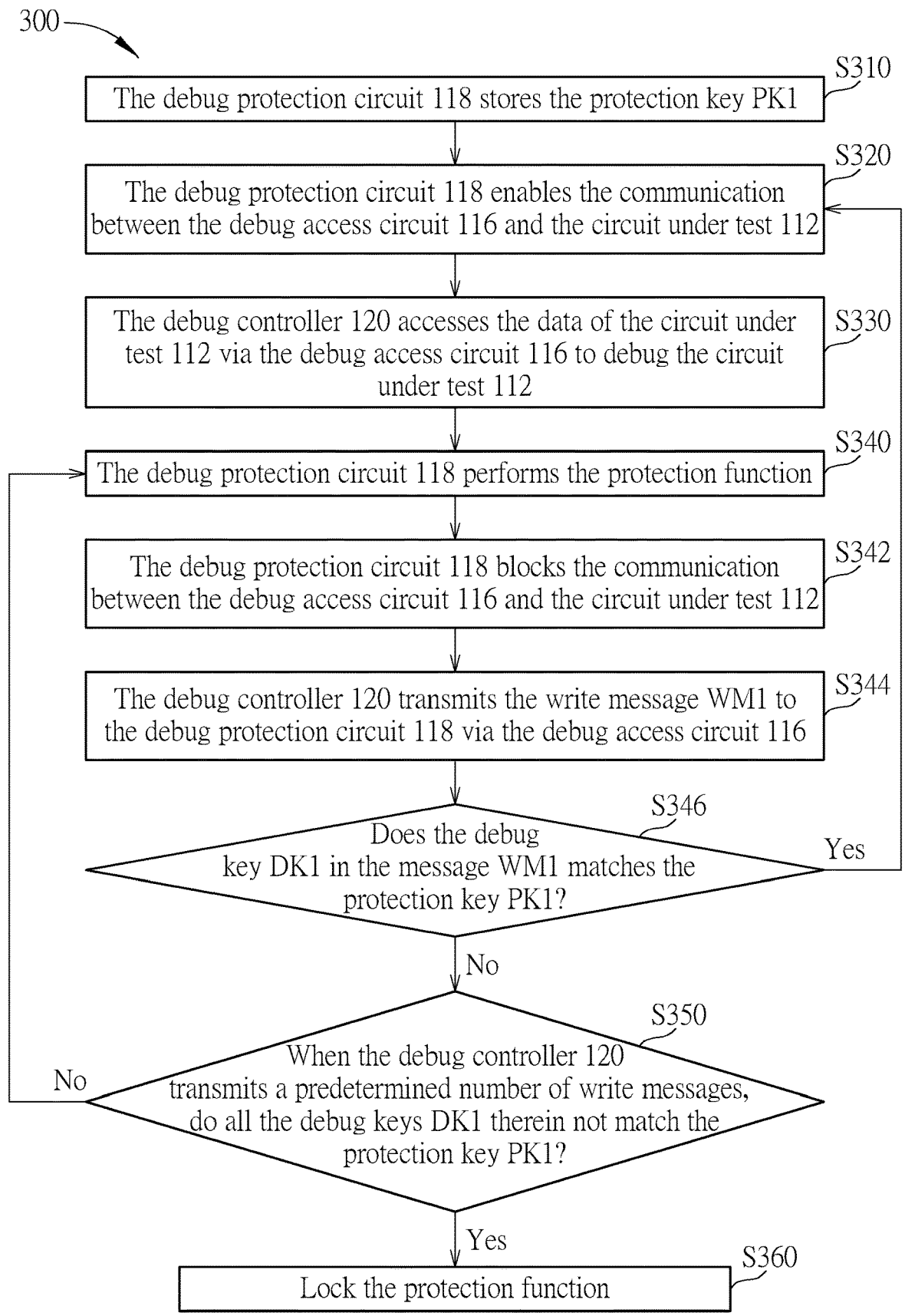
FIG. 3 is a flowchart of a method of operating the debug system in FIG. 1.

FIG. 3 is a flowchart of a method 300 of operating the debug system 100. The method 300 includes Step S310 to S360, S310: The debug protection circuit 118 stores the protection key PK1;

S320: The debug protection circuit 118 enables the communication between the debug access circuit 116 and the circuit under test 112;

S330: The debug controller 120 accesses the data of the circuit under test 112 via the debug access circuit 116 to debug the circuit under test 112;

S340: The debug protection circuit 118 performs the protection function;

S342: The debug protection circuit 118 blocks the communication between the debug access circuit 116 and the circuit under test 112;

S344: The debug controller 120 transmits the write message WM1 to the debug protection circuit 118 via the debug access circuit 116;

S346: If the debug key DK1 in the message WM1 matches the protection key PK1, go to Step S320, otherwise, go to Step S350;

S350: When the debug controller 120 transmits a predetermined number of write messages, and all the debug keys DK1 therein do not match the protection key PK1, proceed to Step S360, otherwise, go to Step S340;

S360: Lock the protection function.

By adopting the method 300, the debug system 100 may use the debug protection circuit 118 to enable the communication between the debug access circuit 116 and the circuit under test 112 in step S320, and the debug controller 120 may access the circuit under test 112 and debug the same via the debug access circuit 116 in Step S330. After the debugging process is completed, the debug protection circuit 118 executes the protection function in Steps S340 and S342 to block the communication between the debug access circuit 116 and the circuit under test 112. When the debug controller 120 is configured to perform the debug process, the debug controller 120 transmits the write message WM1 including the debug key DK1 to the debug protection circuit 118, and the debug protection circuit 118 compares the debug key DK1 and the protection key PK1 in Step S346 to determine whether to disable the protection function.

Further, to prevent unauthorized users from trying to continuously transmit different keys to crack the protection function, the method 300 may further include Step S350, in which after the debug controller 120 transmits a predetermined number of wrong keys, the debug protection circuit 118 will stop comparing the key and lock the protection function to ensure the information security of the circuit under test 112.

In some embodiments, the method 300 may also be applicable to the debug system 200. In such a case, the method 300 may perform the first protection function and the second protection function to protect the first circuit under test 212A and the second circuit under test 212B. Further, the first protection function and the second protection function may be designed to be simultaneously or separately controlled based on system requirements.

The debug system and the method of operating the debug system provided by the embodiments of the present invention adopt the debug protection circuit to enable or block the communication between the debug access circuit and the circuit under test, preventing unauthorized users from accessing the data in the circuit under test via the debug interface, and enhancing the security of the chip under test.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A debug system comprising:
   a chip under test comprising:
      a first circuit under test configured to perform a first function;
      a debug interface;
      a debug access circuit coupled to the first circuit under test and the debug interface; and
      a debug protection circuit coupled to the first circuit under test and the debug access circuit, and configured to enable communication between the debug access circuit and the first circuit under test when a first protection function is disabled, block the communication between the debug access circuit and the first circuit under test when the first protection function is enabled, and determine whether to disable the first protection function according to a first write message transmitted from the debug access circuit; and
   a debug controller selectively coupled to the debug interface and configured to transmit the first write message to the debug protection circuit via the debug access circuit when the first protection function is enabled, and access the data in the first circuit under test via the debug access circuit to debug the first circuit under test when the first protection function is disabled;

wherein:

the first write message comprises a first debug key;

the debug protection circuit is further configured to store a first protection key; and when the first protection function is enabled, if the debug controller continuously transmits a predetermined number of first write messages to the debug protection circuit, and a plurality of first debug keys in the predetermined number of first write messages are different from the first protection key, the debug protection circuit stops determining whether to disable the first protection function according to the first write message, and keeps the first protection function enabled.

2. The debug system of claim 1, wherein the debug access circuit further comprises:

a control interface coupled to the debug protection circuit; and a high-speed interface coupled to the first circuit under test, and having a transmission rate higher than a transmission rate of the control interface.

3. The debug system of claim 1, wherein:

when the first protection function is enabled, the debug protection circuit compares the first debug key and the first protection key, and when the first debug key matches the first protection key, disable the first protection function to enable the communication between the debug access circuit and the first circuit under test.

4. The debug system of claim 1, wherein the chip under test further comprises a one-time programmable (OTP) memory, and the debug protection circuit stores the first protection key in the one-time programmable memory.

5. The debug system of claim 1, wherein:

the first circuit under test is further configured to generate the first protection key, and transmit the first protection key to the debug protection circuit for the debug protection circuit to store the first protection key.

6. The debug system of claim 1, wherein:

the first circuit under test comprises a debug management unit coupled to the debug access circuit and the debug protection circuit; and the debug protection circuit controls the debug management unit to block or enable the communication between the debug access circuit and the first circuit under test.

7. The debug system of claim 1, further comprising:

a second circuit under test coupled to the debug access circuit and the debug protection circuit, and configured to perform a second function;

wherein the debug controller is further configured to transmit a second write message to the debug protection circuit via the debug access circuit when a second protection function is enabled, and access data in the second circuit under test via the debug access circuit to debug the second circuit under test when the second protection function is disabled.

8. The debug system of claim 7, wherein:

the first protection function and the second protection function are enabled or disabled simultaneously; or the first protection function and the second protection function are controlled separately.

9. The debug system of claim 7, wherein:

the second write message comprises a second debug key;

the debug protection circuit is further configured to store a second protection key; and when the second protection function is enabled, the debug protection circuit compares the second debug key and the second protection key, and when the second debug key matches the second protection key, disable the second protection function to enable the communication between the debug access circuit and the second circuit under test.

10. A method of operating a debug system, the debug system comprising a first chip under test and a debug controller, and the first chip under test comprising a first circuit under test, a debug interface, a debug access circuit, and a debug protection circuit, the debug interface being coupled to the debug controller and the debug access circuit, the debug access circuit being coupled to the first chip under test, and the debug protection circuit being coupled to the first chip under test and the debug access circuit, the method comprising:

the debug protection circuit storing a first protection key;

when a first protection function is disabled:

the debug protection circuit enabling communication between the debug access circuit and the first circuit under test; and the debug controller accessing data in the first circuit under test via the debug access circuit to debug the first circuit under test; and when the first protection function is enabled:

the debug protection circuit blocking the communication between the debug access circuit and the first circuit under test;

the debug controller transmitting a first write message to the debug protection circuit via the debug access circuit, wherein the first write message comprises a first debug key;

the debug protection circuit determining whether to disable the first protection function according to the first write message transmitted from the debug access circuit; and if the debug controller continuously transmits a predetermined number of first write messages to the debug protection circuit, and a plurality of first debug keys in the predetermined number of first write messages are different from the first protection key, the debug protection circuit stopping determining whether to disable the first protection function according to the first write message, and keeping the first protection function enabled.

11. The method of claim 10, wherein the debug access circuit comprises:

a control interface coupled to the debug protection circuit; and a high-speed interface coupled to the first circuit under test, and a transmission rate of the high-speed interface is higher than a transmission rate of the control interface.

12. The method of claim 10, wherein:

the debug protection circuit determining whether to disable the first protection function according to the first write message transmitted from the debug access circuit comprises: when the first debug key matches the first protection key, the debug protection circuit disabling the first protection function to enable the communication between the debug access circuit and the first circuit under test.

13. The method of claim 10, further comprising:

the first circuit under test generating the first protection key; and the first circuit under test transmitting the first protection key to the debug protection circuit for the debug protection circuit to store the first protection key.

14. The method of claim 10, wherein the chip under test further comprises a second circuit under test, and the method further comprises:

when a second protection function is enabled:

the debug protection circuit blocking communication between the debug access circuit and the second circuit under test;

the debug controller transmitting a second write message to the debug protection circuit via the debug access circuit; and the debug protection circuit determining whether to disable the second protection function according to the second write message transmitted from the debug access circuit; and when the second protection function is disabled:

the debug protection circuit enabling the communication between the debug access circuit and the second circuit under test; and the debug controller accessing data in the second circuit under test via the debug access circuit to debug the second circuit under test.

15. The method of claim 14, wherein:

the first protection function and the second protection function are enabled or disabled simultaneously.

16. The method of claim 14, further comprising the debug protection circuit storing the second protection key;

wherein:

the second write message comprises a second debug key; and the debug protection circuit determining whether to disable the second protection function according to the second write message transmitted from the debug access circuit comprises when the second debug key matches the second protection key, disabling the second protection function.

* * * * *